United States Patent
Yuan

(10) Patent No.: US 11,009,569 B2
(45) Date of Patent: May 18, 2021

(54) MAGNETIC FIELD SENSING DEVICE

(71) Applicant: Fu-Te Yuan, New Taipei (TW)

(72) Inventor: Fu-Te Yuan, New Taipei (TW)

(73) Assignee: iSentek Inc., New Taipei (TW)

( * ) Notice: Subject to any disclaimer, the term of this patent is extended or adjusted under 35 U.S.C. 154(b) by 95 days.

(21) Appl. No.: 16/522,691

(22) Filed: Jul. 26, 2019

(65) Prior Publication Data

US 2020/0057121 A1  Feb. 20, 2020

Related U.S. Application Data

(60) Provisional application No. 62/719,147, filed on Aug. 17, 2018.

(30) Foreign Application Priority Data

May 31, 2019 (TW) ................... 108118911

(51) Int. Cl.
| | |
|---|---|
| *G01R 33/09* | (2006.01) |
| *H01L 43/08* | (2006.01) |
| *H01F 10/32* | (2006.01) |
| *H01L 27/22* | (2006.01) |

(52) U.S. Cl.
CPC ....... *G01R 33/093* (2013.01); *H01F 10/3254* (2013.01); *H01F 10/3286* (2013.01); *H01L 27/22* (2013.01); *H01L 43/08* (2013.01)

(58) Field of Classification Search
CPC ................................................. G01R 33/0093
See application file for complete search history.

(56) References Cited

U.S. PATENT DOCUMENTS

| | | | |
|---|---|---|---|
| 7,057,862 B2 * | 6/2006 | Kasiraj | G11B 5/1278 360/324.12 |
| 8,018,690 B2 | 9/2011 | Min et al. | |
| 10,571,527 B2 * | 2/2020 | Suess | G01R 33/0011 |
| 10,585,148 B2 * | 3/2020 | Bachleitner Hofmann | H01L 43/08 |

FOREIGN PATENT DOCUMENTS

| | | |
|---|---|---|
| CN | 1655374 | 8/2005 |
| TW | 200410247 | 6/2004 |
| TW | 200625305 | 7/2006 |

\* cited by examiner

*Primary Examiner* — Reena Aurora
(74) *Attorney, Agent, or Firm* — JCIPRNET

(57) ABSTRACT

A magnetic field sensing device includes at least one vortex magnetoresistor and at least one magnetization setting element. The vortex magnetoresistor includes a pinning layer, a pinned layer, a spacer layer, and a round free layer. The pinned layer is disposed on the pinning layer, and the spacer layer is disposed on the pinned layer. The round free layer is disposed on the spacer layer, and has a magnetization direction distribution with a vortex shape. The magnetization setting element is alternately applied and not applied an electric current to. When the magnetization setting element is not applied the electric current to, the magnetization direction distribution with the vortex shape of the round free layer is varied with an external magnetic field. When the magnetization setting element is applied the electric current to, a magnetic field generated by the magnetization setting element makes the round free layer achieve magnetic saturation.

11 Claims, 10 Drawing Sheets

MAGNETIC FIELD SENSING DEVICE

CROSS-REFERENCE TO RELATED APPLICATION

This application claims the priority benefits of U.S. provisional application Ser. No. 62/719,147, filed on Aug. 17, 2018, and Taiwan application serial no. 108118911, filed on May 31, 2019. The entirety of each of the above-mentioned patent applications is hereby incorporated by reference herein and made a part of this specification.

BACKGROUND

Technical Field

The disclosure relates to a magnetic field sensing device.

Description of Related Art

A magnetic field sensing device is an essential device for providing a system with electronic compass and motion tracking functions. In recent years, related applications have experienced rapid development, especially the applications configured for portable devices. In the next-generation applications, high accuracy, fast response, small volume, low power consumption, and reliable quality are the important features pursued by the magnetic field sensing devices.

A conventional giant magnetoresistor or tunneling magnetoresistor generally includes a structure formed by a pinning layer, a pinned layer, a spacer layer, and a free layer sequentially stacked together, and the free layer has a magnetic easy-axis perpendicular to the pinning direction of the pining layer. If a single-axis magnetic sensor having a Wheatstone bridge is to be formed, a plurality of magnetoresistors having different pinning directions are required. As regards a 3-axis magnetic sensor, a plurality of magnetoresistors respectively having 6 pinning directions are required. Nevertheless, from a manufacturing point of view, when a second pinning direction is to be manufactured in the pinning layer in one wafer, costs may increase significantly, and stability of configuration of the magnetization direction in the pinned layer may also be lowered.

In addition, flicker noise (i.e., pink noise) exists in signals generated by a general magnetic field sensor, and such flicker noise may influence accuracy of the strength of the magnetic field sensed by the magnetic field sensor.

SUMMARY

The disclosures provide a magnetic field sensing device capable of effectively overcoming interference generated by flicker noise.

A magnetic field sensing device provided by an embodiment of the disclosure includes at least one vortex magnetoresistor and at least one magnetization setting element. The at least one vortex magnetoresistor includes a pinning layer, a pinned layer, a spacer layer, and a round free layer. The pinned layer is disposed on the pinning layer, the spacer layer is disposed on the pinned layer, and the round free layer is disposed on the spacer layer and has a magnetization direction distribution with a vortex shape. The at least one magnetization setting element is disposed at one side of the at least one vortex magnetoresistor, and the at least one magnetization setting element is alternately applied and not applied an electric current to. When the at least one magnetization setting element is not applied the electric current to, the magnetization direction distribution with the vortex shape of the round free layer is varied with an external magnetic field to sense the external magnetic field. When the at least one magnetization setting element is applied the electric current to, a magnetic field generated by the at least one magnetization setting element destroys the magnetization direction distribution with the vortex shape of the round free layer and makes the round free layer achieve magnetic saturation.

In the magnetic field sensing device provided by the embodiments of the disclosure, since the round free layer having the magnetization direction distribution with the vortex shape is adopted, the direction of the external magnetic field sensed by the vortex magnetoresistor is less limited. In addition, in the magnetic field sensing device provided by the embodiments of the disclosure, since the magnetization setting element capable of destroying the magnetization direction distribution with the vortex shape of the round free layer is adopted to measure the flicker noise of the magnetic field sensing device itself, the magnetic field sensing device provided by the embodiments of the disclosure may effectively overcome the interference generated by the flicker noise.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 4A to FIG. 4D are diagrams illustrating four variations in magnetization direction distributions of a round free layer in FIG. 3 when being applied external magnetic fields in four different directions to.

FIG. 5 are graphs illustrating variations in an electrical resistance of the vortex magnetoresistor in FIG. 3 when being applied external magnetic fields in different directions to or not being applied an external magnetic field to.

DESCRIPTION OF THE EMBODIMENTS

Figure 1:
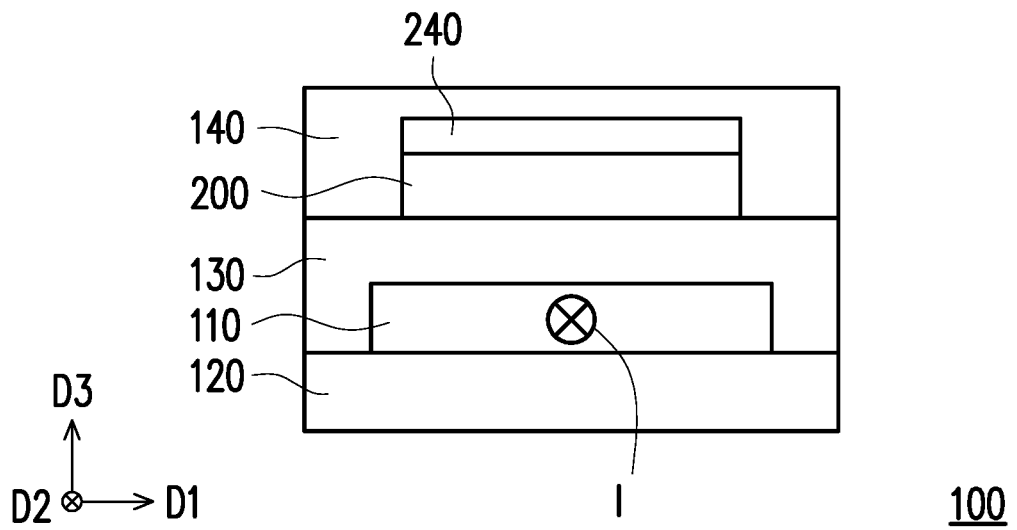
FIG. 1 is a schematic cross-sectional view of a magnetic field sensing device according to an embodiment of the disclosure.
Figure 2:
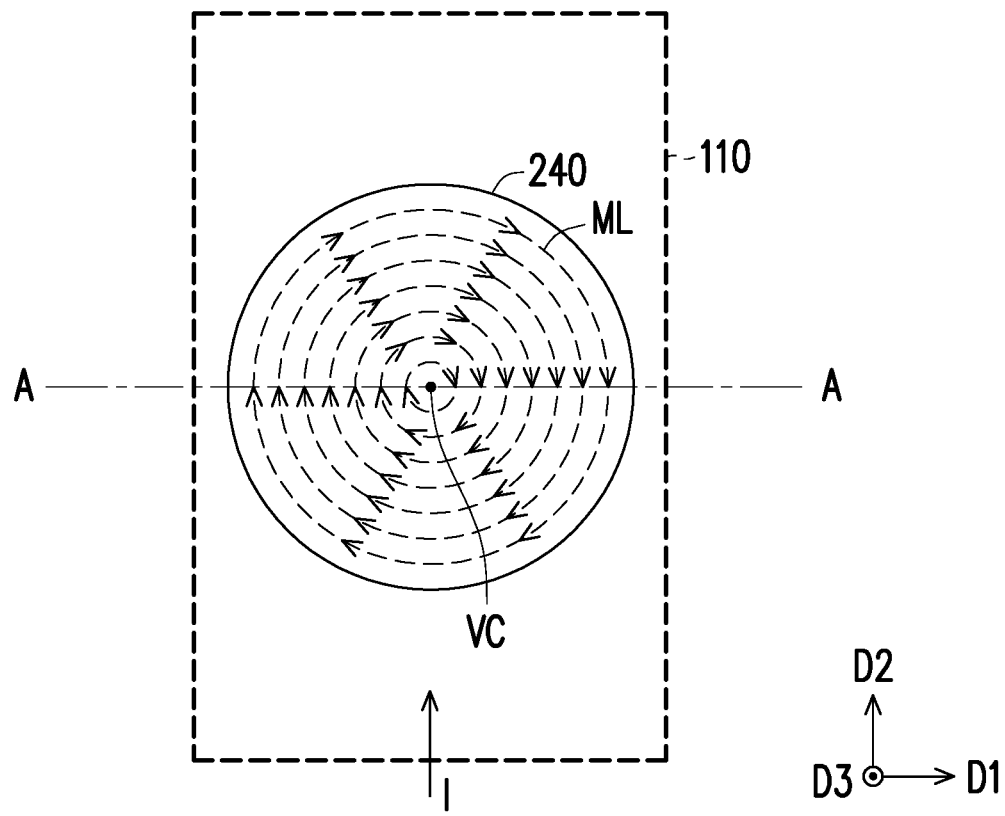
FIG. 2 is a schematic top view of a vortex magnetoresistor and a magnetization setting element in FIG. 1.
Figure 3:
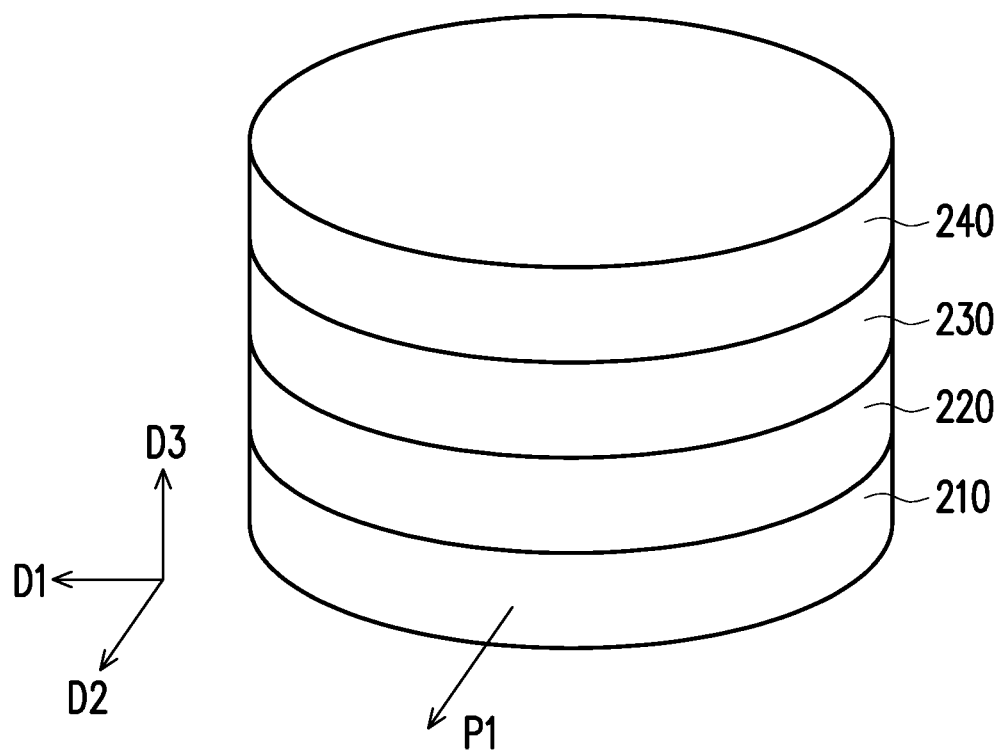
FIG. 3 is a schematic perspective view of the vortex magnetoresistor in FIG. 1.

FIG. 1 is a schematic cross-sectional view of a magnetic field sensing device according to an embodiment of the disclosure, FIG. 2 is a schematic top view of a vortex magnetoresistor and a magnetization setting element in FIG. 1, and FIG. 3 is a schematic perspective view of the vortex magnetoresistor in FIG. 1. With reference to FIG. 1 to FIG. 3, a magnetic field sensing device 100 of this embodiment includes at least one vortex magnetoresistor 200 and at least one magnetization setting element 110. The at least one vortex magnetoresistor 200 includes a pinning layer 210, a pinned layer 220, a spacer layer 230, and a round free layer 240. The pinned layer 220 is disposed on the pinning layer 210, the spacer layer 230 is disposed on the pinned layer 220, and the round free layer 240 is disposed on the spacer layer 230. In this embodiment, the pinning layer 210 provides a pinning direction P1, so that a magnetization direction of the pinned layer 220 is fixed to the pinning direction P1. In this embodiment, a material of the pinning layer 210 is an antiferromagnetic material, a material of the pinned layer 220 and the round free layer 240 is a ferromagnetic material, where the material of the round free layer 240 is a soft magnetic material.

In this embodiment, the magnetic field sensing device 100 may be positioned in a space formed by a first direction D1, a second direction D2, and a third direction D3, and the first direction D1, the second direction D2, and the third direction D3 are perpendicular to one another. In this embodiment, the pinning direction P1 is parallel to the second direction D2, and film layers such as the pinning layer 210, the pinned layer 220, the spacer layer 230, and the round free layer 240 are all parallel to a plane formed by the first direction D1 and the second direction D2.

The round free layer 240 has a magnetization direction distribution with a vortex shape. Specifically, when an external magnetic field is not provided, a magnetization direction ML of the round free layer 240 is arranged into a plurality of circles along a circular outline of the round free layer 240. Diameters of the circles gradually reduce and eventually converge on a center of the circular outline. The magnetization direction ML may be arranged in a clockwise direction and may also be arranged in a counter-clockwise direction. A vortex core VC is formed in the center of the round free layer 240. Moreover, a magnetization direction of the vortex core VC is perpendicular to the round free layer 240 and may be upward (i.e., toward the third direction D3 in FIG. 2 and FIG. 3) or may be downward (i.e., toward an opposite direction of the third direction D3). At this time, a net magnetization of the entire round free layer 240 is zero.

In this embodiment, the vortex magnetoresistor 200 may be a giant magnetoresistor (GMR) or a tunneling magnetoresistor (TMR). When the vortex magnetoresistor 200 is a giant magnetoresistor, the spacer layer 230 thereof is a non-magnetic metal layer, and when the vortex magnetoresistor 200 is a tunneling magnetoresistor, the spacer layer 230 thereof is an insulation layer.

The at least one magnetization setting element 110 is disposed at one side of the at least one vortex magnetoresistor 200. In this embodiment, the magnetization setting element 110 may be, for example, a conductive sheet, a conductive coil, a conductive wire, or a conductor and may generate a magnetic field through being applied an electric current to, so as to generate the magnetic field configured to set the magnetization direction of the round free layer 240 at the round free layer 240.

The at least one magnetization setting element 110 is alternately applied and not applied an electric current to. When the at least one magnetization setting element 110 is not applied the electric current to, the magnetization direction distribution with the vortex shape of the round free layer 240 is varied with an external magnetic field to sense the external magnetic field. When the at least one magnetization setting element 110 is applied the electric current to, a magnetic field generated by the at least one magnetization setting element 110 destroys the magnetization direction distribution with the vortex shape of the round free layer 240 and makes the round free layer 240 achieve magnetic saturation.

Figure 4A:
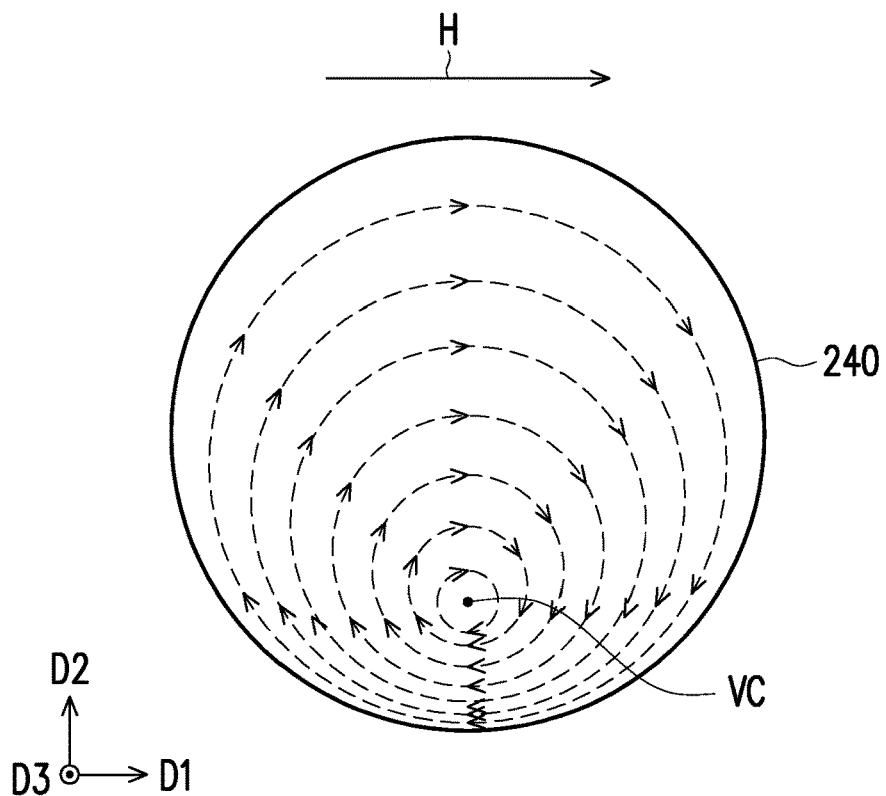

To be specific, with reference to FIG. 4A, when an external magnetic field H in the first direction D1 passes through the vortex magnetoresistor 200, an area of one side of the vortex core VC facing the second direction D2 expands, an area of one side of the vortex core VC facing an opposite direction of the second direction D2 decreases, and magnetization directions in the areas of the two sides are opposite to each other. As such, the entire round free layer 240 generates a net magnetization facing the first direction D1, and the vortex core VC moves towards the opposite direction of the second direction D2.

Figure 4B:
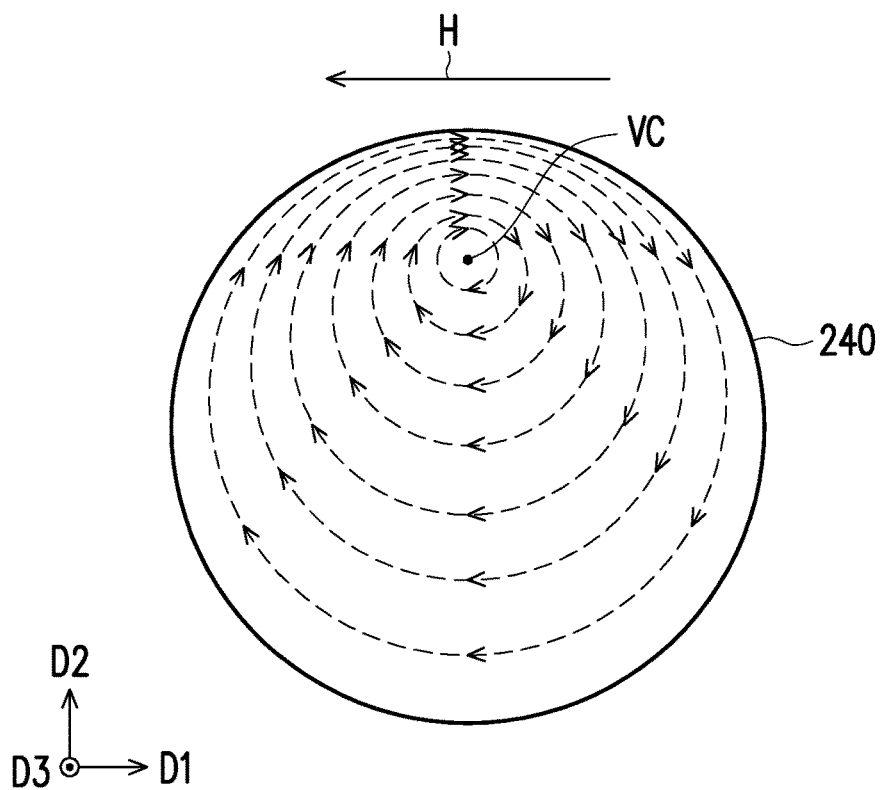

With reference to FIG. 4B, when an external magnetic field H in an opposite direction of the first direction D1 passes through the vortex magnetoresistor 200, the area of one side of the vortex core VC facing the second direction D2 decreases, the area of one side of the vortex core VC facing the opposite direction of the second direction D2 expands, and the magnetization directions in the areas of the two sides are opposite to each other. As such, the entire round free layer 240 generates a net magnetization facing the opposite direction of the first direction D1, and the vortex core VC moves towards the second direction D2.

Figure 4C:
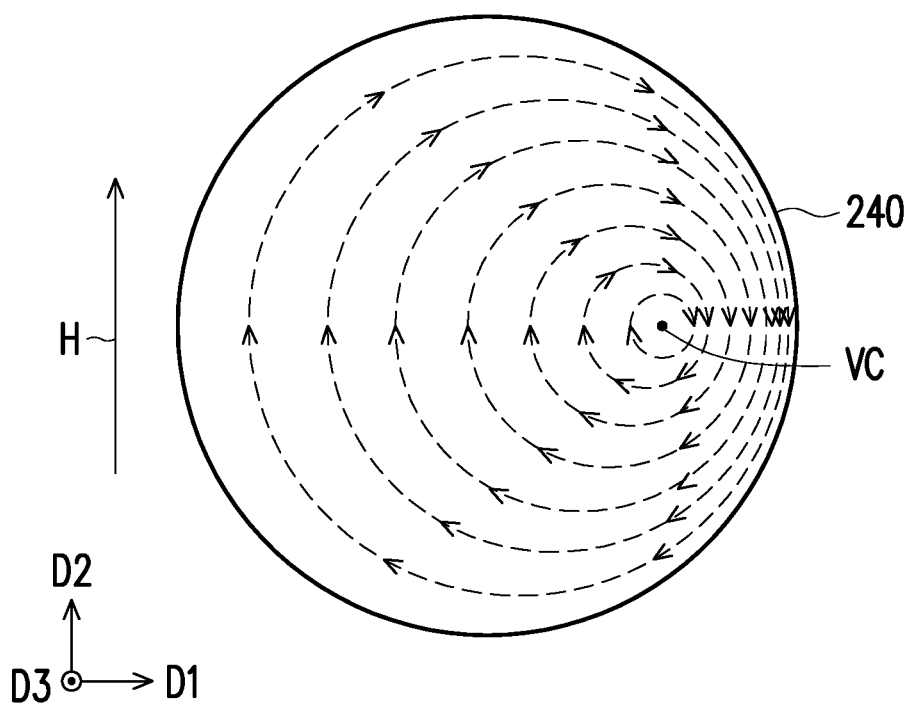

With reference to FIG. 4C, when an external magnetic field H in the second direction D2 passes through the vortex magnetoresistor 200, an area of one side of the vortex core VC facing the first direction D1 decreases, an area of one side of the vortex core VC facing the opposite direction of the first direction D1 expands, and magnetization directions in the areas of the two sides are opposite to each other. As such, the entire round free layer 240 generates a net magnetization facing the second direction D1, and the vortex core VC moves towards the first direction D1.

Figure 4D:
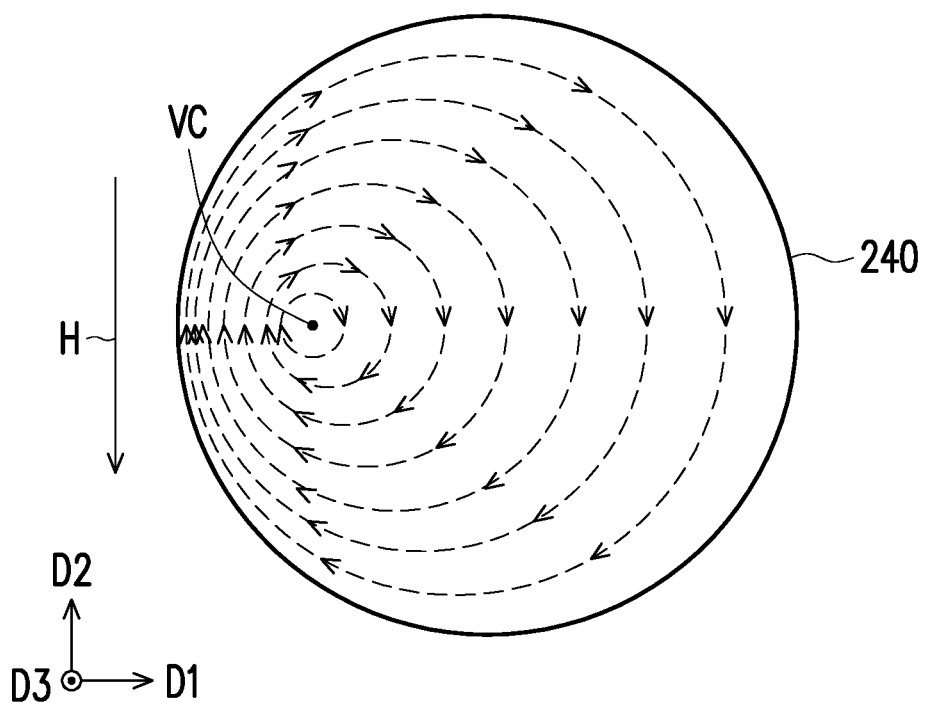

With reference to FIG. 4D, when an external magnetic field H in the opposite direction of the second direction D2 passes through the vortex magnetoresistor 200, the area of one side of the vortex core VC facing the first direction D1 expands, the area of one side of the vortex core VC facing the opposite direction of the first direction D1 decreases, and the magnetization directions in the areas of the two sides are opposite to each other. As such, the entire round free layer 240 generates a net magnetization facing the opposite direction of the second direction D2, and the vortex core VC moves towards the opposite direction of the first direction D1.

Figure 5:
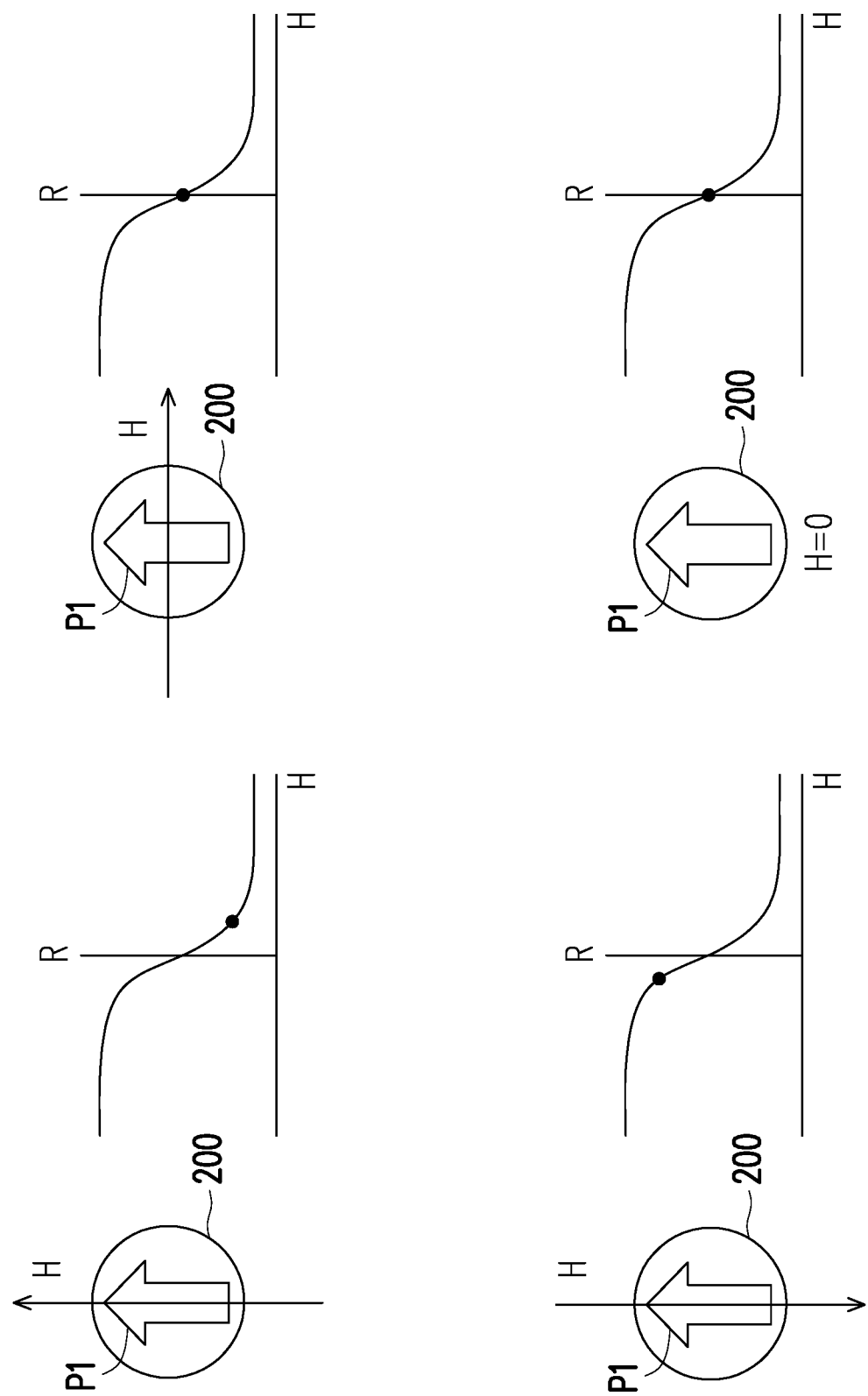

FIG. 5 are graphs illustrating variations in an electrical resistance of the vortex magnetoresistor in FIG. 3 when being applied external magnetic fields in different directions to or not being applied an external magnetic field to. With reference to FIG. 3, FIG. 4A to FIG. 4D, and FIG. 5, the curve graphs in FIG. 5 show variations in an electrical resistance R of the vortex magnetoresistor 200 with respect to variations of the external magnetic field H. As shown in the upper left graph of FIG. 5, when one external magnetic field H with a direction identical to the pinning direction P1 is applied to the vortex magnetoresistor 200, the round free layer 240 generates a net magnetization in the pinning direction P1 as shown in FIG. 4C. As such, the electrical resistance R drops, that is, the value of the electrical resistance R corresponding to the black dot in the curve graph. As shown in the lower left graph of FIG. 5, when an external magnetic field H with an opposite direction of the pinning direction P1 is applied to the vortex magnetoresistor 200, the round free layer 240 generates a net magnetization in the opposite direction of the pinning direction P1 as shown in FIG. 4D. As such, the electrical resistance R rises, that is, the value of the electrical resistance R corresponding to the black dot in the curve graph. As shown in the upper right graph of FIG. 5, when one external magnetic field H with a direction perpendicular to the pinning direction P1 is applied to the vortex magnetoresistor 200, the round free layer 240 generates a net magnetization in the direction perpendicular to the pinning direction P1 as shown in FIG. 4A or FIG. 4B. An orthogonal projection of the net magnetization in the pinning direction P1 is zero. As such, the electrical resistance R remains the same, that is, the value of the electrical resistance R corresponding to the black dot in the curve graph. Further, as shown in the lower right graph of FIG. 5, when no magnetic field is applied to the vortex magnetoresistor 200, the electrical resistance R thereof remains the same, that is, the value of the electrical resistance R corresponding to the black dot in the curve graph.

Figure 6A:
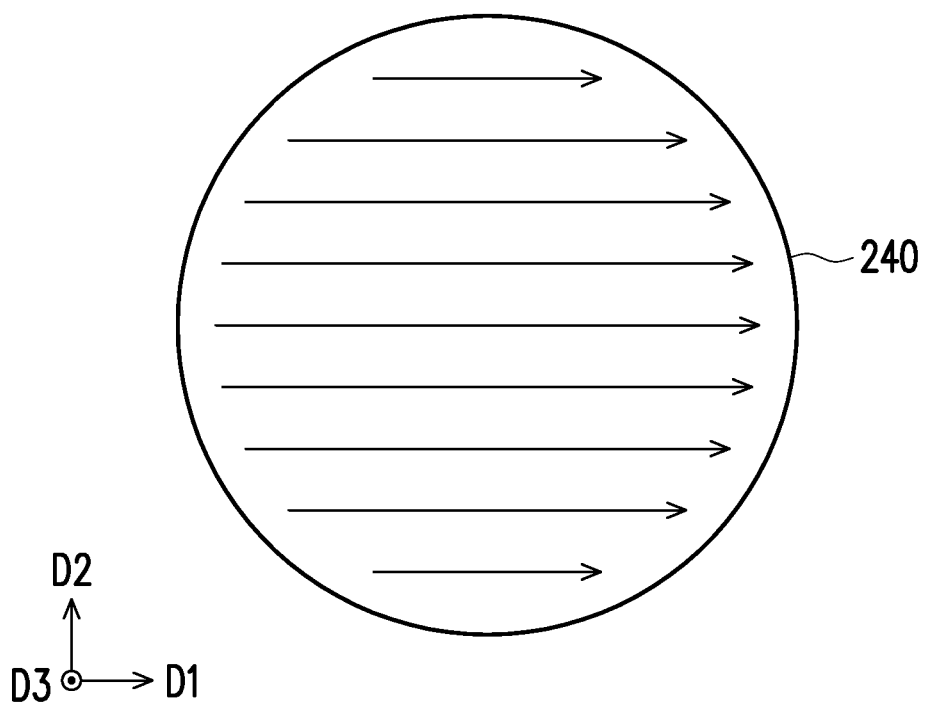
FIG. 6A to FIG. 6D are diagrams illustrating directions of a saturation magnetization generated by the vortex magnetoresistor of FIG. 1 and FIG. 2 after being applied a magnetic field to by the magnetization setting element.

FIG. 6A to FIG. 6D are diagrams illustrating directions of a saturation magnetization generated by the vortex magnetoresistor of FIG. 1 and FIG. 2 after being applied a magnetic field to by the magnetization setting element. With reference to FIG. 1, FIG. 2, and FIG. 6A, when the magnetization setting element 110 as shown in FIG. 1 and FIG. 2 is applied an electric current I flowing to the second direction D2 to, a strong magnetic field facing the first direction D1 is generated at the round free layer 240. As such, the round free layer 240 achieves magnetic saturation and generates a saturation magnetization in the first direction D1. At this time, the round free layer 240 forms a single domain, and magnetization directions of all positions thereof face the first direction D1. Since the saturation magnetization is perpendicular to the pinning direction P1 (i.e., the second direction D2), the electrical resistance R of the vortex magnetoresistor 200 theoretically does not change.

Figure 6B:
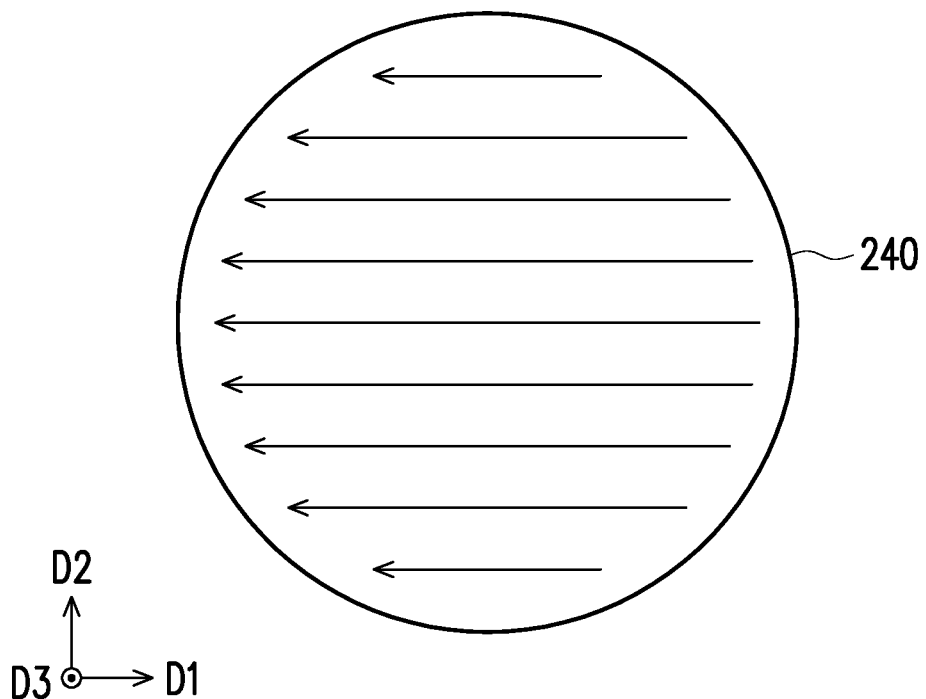

With reference to FIG. 1, FIG. 2, and FIG. 6B, when the flowing direction of the electric current I of the magnetization setting element 110 shown in FIG. 1 and FIG. 2 is changed to the opposite direction of the second direction D2, a strong magnetic field facing the opposite direction of the first direction D1 is generated at the round free layer 240. As such, the round free layer 240 achieves magnetic saturation and generates a saturation magnetization in the opposite direction of the first direction D1. At this time, the round free layer 240 forms a single domain, and magnetization directions of all positions thereof face the opposite direction of the first direction D1. Since the saturation magnetization is perpendicular to the pinning direction P1 (i.e., the second direction D2), the electrical resistance R of the vortex magnetoresistor 200 theoretically does not change.

Figure 6C:
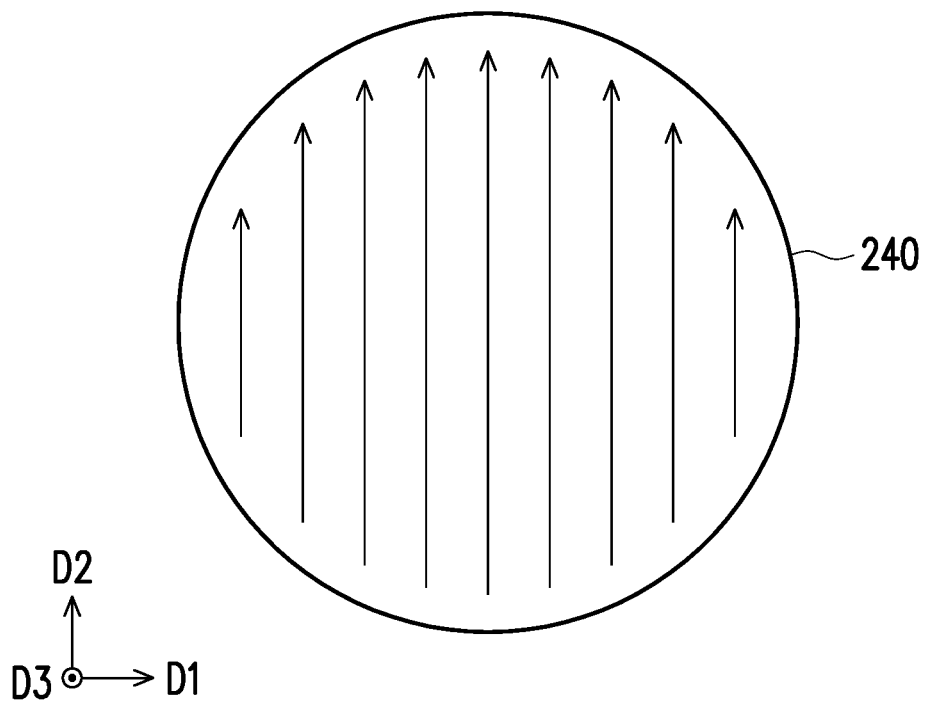

With reference to FIG. 1, FIG. 2, and FIG. 6C, when an extending direction of the magnetization setting element 110 shown in FIG. 1 and FIG. 2 is changed from the original second direction D2 to the first direction D1 and the flowing direction of the electric current I is changed to the opposite direction of the first direction D1, a strong magnetic field facing the second direction D2 is generated at the round free layer 240. As such, the round free layer 240 achieves magnetic saturation and generates a saturation magnetization in the second direction D2. At this time, the round free layer 240 forms a single domain, and magnetization directions of all positions thereof face the second direction D2. Since the saturation magnetization is identical to the pinning direction P1 (i.e., the second direction D2), the electrical resistance R of the vortex magnetoresistor 200 drops to a minimum value.

Figure 6D:
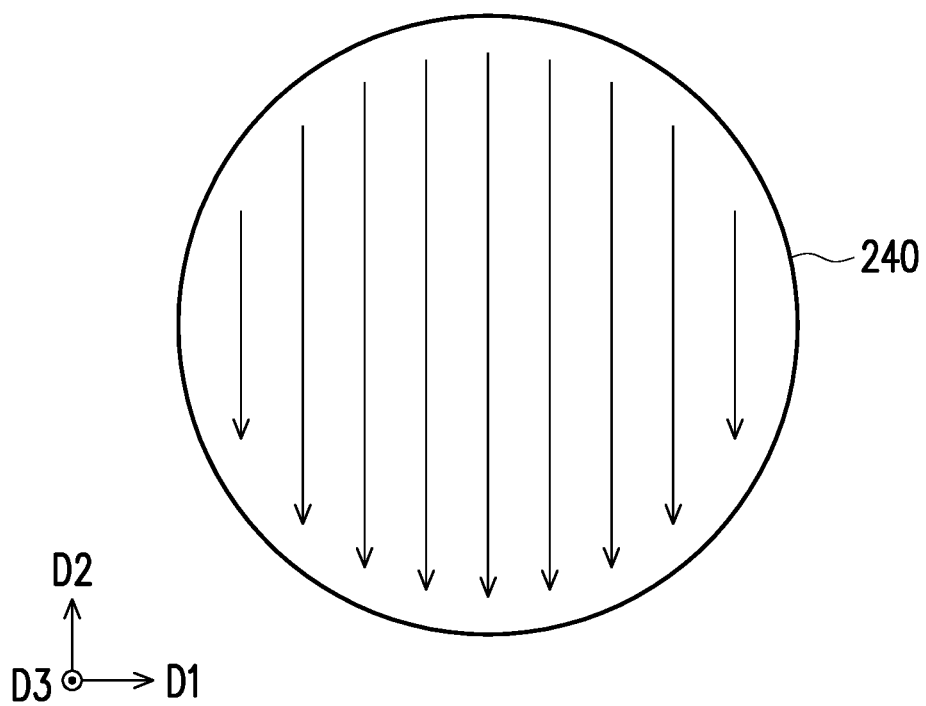

With reference to FIG. 1, FIG. 2, and FIG. 6D next, when the extending direction of the magnetization setting element 110 shown in FIG. 1 and FIG. 2 is changed from the original second direction D2 to the first direction D1 and the flowing direction of the electric current I is changed to the first direction D1, a strong magnetic field facing the opposite direction of the second direction D2 is generated at the round free layer 240. As such, the round free layer 240 achieves magnetic saturation and generates a saturation magnetization in the opposite direction of the second direction D2. At this time, the round free layer 240 forms a single domain, and magnetization directions of all positions thereof face the opposite direction of the second direction D2. Since the saturation magnetization is opposite to the pinning direction P1 (i.e., the second direction D2), the electrical resistance R of the vortex magnetoresistor 200 rises to a maximum value.

When the magnetization setting element 110 is not applied the electric current to, the vortex magnetoresistor 200 may sense the external magnetic field H, as shown in FIG. 4A to FIG. 4D. At this time, an output signal of the vortex magnetoresistor 200 includes a part corresponding to the external magnetic field H and a part corresponding to flicker noise of the system. When the magnetization setting element 110 is applied the electric current to so that the vortex magnetoresistor 200 achieves magnetic saturation, the output signal of the vortex magnetoresistor corresponds to the flicker noise of the system. Therefore, when the magnetization setting element 110 is alternately applied and not applied the electric current to and a subtraction is performed to the output signal of the vortex magnetoresistor 200 under the two states, an influence generated by the flicker noise of the system may be subtracted, so that a more accurate signal corresponding to the external magnetic field H is obtained.

In this embodiment, the magnetic field sensing device 100 further includes a substrate 120, a first insulation layer 130, and a second insulation layer 140. The magnetization setting element 110 is disposed on the substrate 120, the first insulation layer 130 covers the magnetization setting element 110, the vortex magnetoresistor 200 is disposed on the first insulation layer 130, and the second insulation layer 140 covers the vortex magnetoresistor 200. In this embodiment, the substrate 120 is a circuit substrate, such as a semiconductor substrate having a circuit.

Figure 7:
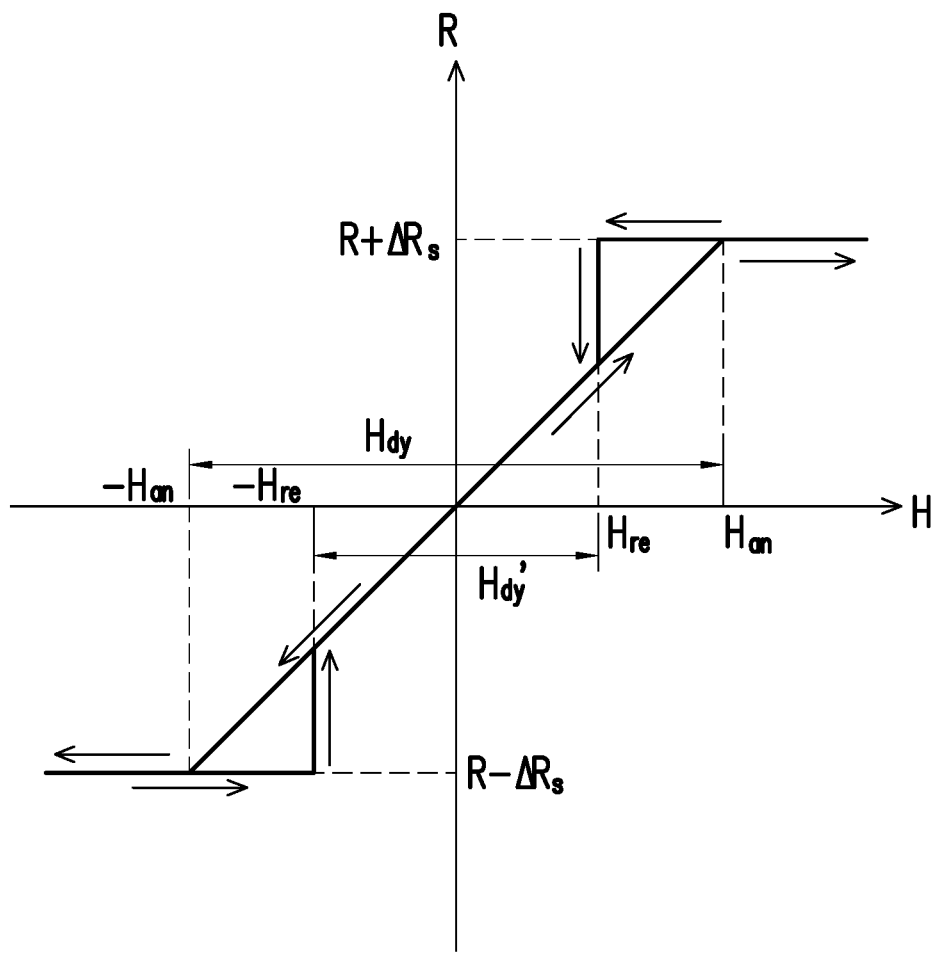
FIG. 7 is a graph illustrating a transfer curve of the vortex magnetoresistor of FIG. 1.

FIG. 7 is a graph illustrating a transfer curve of the vortex magnetoresistor of FIG. 1. With reference to FIG. 1, FIG. 2, FIG. 3, and FIG. 7, when a positive external magnetic field H or a negative external magnetic field H in the opposite direction of the pinning direction P1 is applied onto the vortex magnetoresistor 200, the electrical resistance R of the vortex magnetoresistor 200 increases or decreases along with an increase in an absolute value of the external magnetic field H. When strength of the external magnetic field H increases or decreases to $H_{an}$ or $-H_{an}$, the electrical resistance R of the vortex magnetoresistor 200 reaches a saturation value $R+\Delta R_s$ or $R-\Delta R_s$. At this time, the vortex core VC disappears, and the round free layer 240 has a single domain and a net magnetization thereof achieves saturation magnetization.

When the absolute value of the external magnetic field H begins to drop from the saturation point described above (i.e., beginning to drop from $H_{an}$ or beginning to increase from $-H_{an}$), the saturation value (i.e., $R+\Delta R_s$ or $R-\Delta R_s$) of the vortex magnetoresistor 200 continues to be maintained. Not until the absolute value of the external magnetic field H is less than $H_{re}$ (i.e., the external magnetic field is less than $H_{re}$ or greater than $-H_{re}$) does the vortex core VC reappear.

In this way, a first working range $H_{dy}'$ of the vortex magnetoresistor 200 may be defined to range from $-H_{re}$ to $+H_{re}$, and a second working range may be a range outside $H_{dy}$, that is, a range less than $-H_{an}$ or greater than $+H_{an}$. In the first working range, the magnetization direction distribution with the vortex shape of the round free layer 240 is stably present. In the second working range, the absolute value of the magnetic field set by the magnetization setting element 110 exceeds the absolute value of $+H_{an}$ or $-H_{an}$, and at this time, the round free layer 240 becomes a single domain having saturated net magnetization.

Figure 8:
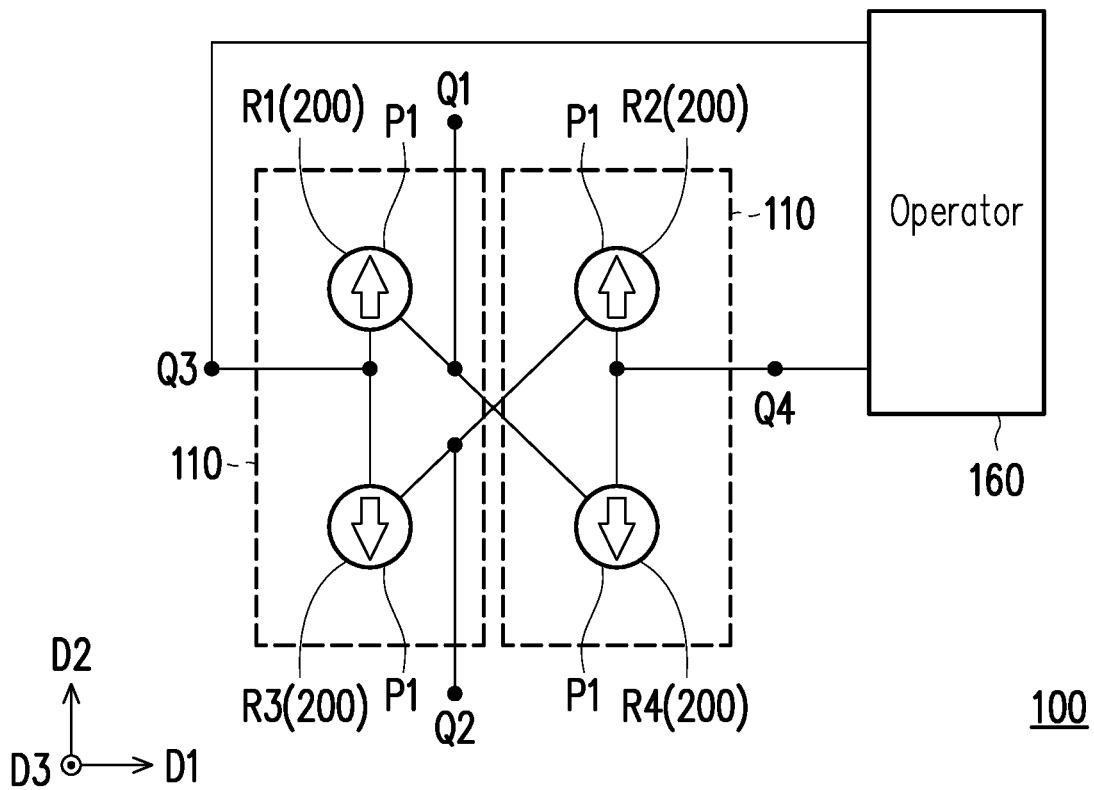
FIG. 8 is a schematic top view of the magnetic field sensing device according an embodiment of the disclosure.

FIG. 8 is a schematic top view of the magnetic field sensing device according an embodiment of the disclosure. With reference to FIG. 1, FIG. 2, FIG. 3, and FIG. 8, one vortex magnetoresistor 200 and one magnetization setting element 110 are taken as an example for illustration in FIG. 1, FIG. 2, and FIG. 3. In one embodiment; however, as shown in FIG. 8, the magnetic field sensing device 100 may include a plurality of vortex magnetoresistors 200 (e.g., 4 vortex magnetoresistors such as a first vortex magnetoresistor R1, a second vortex magnetoresistor R2, a third vortex magnetoresistor R3, and a fourth vortex magnetoresistor R4) and a plurality of magnetization setting elements 110 (e.g., two magnetization setting elements 110, one of the two magnetization setting elements 110 overlap the vortex magnetoresistors R1 and R3, and the other one overlap the vortex magnetoresistors R2 and R4). That is, these vortex magnetoresistors 200 are the plurality of vortex magnetoresistors 200 which are electrically connected to form a Wheatstone bridge. When the vortex magnetoresistors 200 sense an external magnetic field (i.e., the magnetization setting elements 110 are not applied the electric current to), the Wheatstone bridge outputs a differential signal corresponding to the external magnetic field.

To be specific, the first vortex magnetoresistor R1 is electrically connected to the third vortex magnetoresistor R3 and the fourth vortex magnetoresistor R4, and the second vortex magnetoresistor R2 is electrically connected to the third vortex magnetoresistor R3 and the fourth vortex magnetoresistor R4. In addition, the pinning direction P1 of the first vortex magnetoresistor R1 is identical to the pinning direction P1 of the second vortex magnetoresistor R2, and the pinning directions both face the second direction D2. The pinning direction P1 of the third vortex magnetoresistor R3 is identical to the pinning direction P1 of the fourth vortex magnetoresistor R4, and the pinning directions both face the opposite direction of the second direction D2. In addition, the pinning direction P1 of the first vortex magnetoresistor R1 is opposite to the pinning direction P1 of the third vortex magnetoresistor R3.

When the external magnetic field has a magnetic field component in the second direction D2, an electrical resistance of the first vortex magnetoresistor R1 generates a change of $-\Delta R$, and an electrical resistance of the second vortex magnetoresistor R2 generates a change of $-\Delta R$. Further, since the pinning directions P1 of the third vortex magnetoresistor R3 and the fourth vortex magnetoresistor R4 face the opposite direction of the second direction D2, an electrical resistance of the third vortex magnetoresistor R3 generates a change of $+\Delta R$ and an electrical resistance of the fourth vortex magnetoresistor R4 generates a change of $+\Delta R$. In this way, when a contact Q1 receives a reference voltage VDD and a contact Q2 is coupled to the ground, a voltage difference between a contact Q3 and a contact Q4 is $(VDD)\times(\Delta R/R)$, which may be an output signal. This output signal is a differential signal, and its strength corresponds to strength of the magnetic field component of the external magnetic field in the second direction D2. Herein, the contact Q1 is coupled to a conductive path between the first vortex magnetoresistor R1 and the fourth vortex magnetoresistor R4. The contact Q2 is coupled to a conductive path between the second vortex magnetoresistor R2 and the third vortex magnetoresistor R3. The contact Q3 is coupled to a conductive path between the first vortex magnetoresistor R1 and the third vortex magnetoresistor R3. The contact Q4 is coupled to a conductive path between the second vortex magnetoresistor R2 and the fourth vortex magnetoresistor R4.

In this embodiment, the Wheatstone bridge is electrically connected to an operator 160. When the round free layers 240 of the vortex magnetoresistors 200 are in a state of magnetic saturation, the Wheatstone bridge outputs a null signal. The operator 160 is configured to subtract the null signal from the differential signal corresponding to the external magnetic field to obtain a net output signal. The influence generated by the flicker noise is deducted from such net output signal, so that the strength of the external magnetic field may be reflected more accurately. In this embodiment, when the magnetization setting elements 110 are applied the electric current to, the electric current I flows to the second direction D2. The directions of the magnetic fields generated at the first to the fourth vortex magnetoresistors R1, R2, R3, and R4 by the magnetization setting elements are perpendicular to the pinning directions P1 of the first to the fourth vortex magnetoresistors R1, R2, R3, and R4. At this time, the null signal includes only the part of the flicker noise. When the null signal is subtracted from the differential signal corresponding to the external magnetic field, the net output signal capable of responding to the external magnetic field may thereby be obtained. Nevertheless, when the magnetization setting elements 110 are arranged in a manner of which the directions of the magnetic fields generated at the first to the fourth vortex magnetoresistors R1, R2, R3, and R4 are parallel to or anti-parallel to the pinning directions P1 of the first to the fourth vortex magnetoresistors R1, R2, R3, and R4, the null signal includes not only the flicker noise part but also a saturation signal (may be a positive value or a negative value). That is, the electrical resistance of one part of the first to the fourth vortex magnetoresistors R1, R2, R3, and R4 increases to the maximum value, and the electrical resistance of the other part increases to the minimum value. At this time, the operator subtracts the null signal from the differential signal corresponding to the external magnetic field, and the saturation signal may be added back or be subtracted, so that the net output signal accurately corresponding to the external magnetic field is obtained. In this embodiment, the operator 160 is, for example, an arithmetic operator, which may be disposed on the substrate 120 or in the substrate 120.

Figure 9:
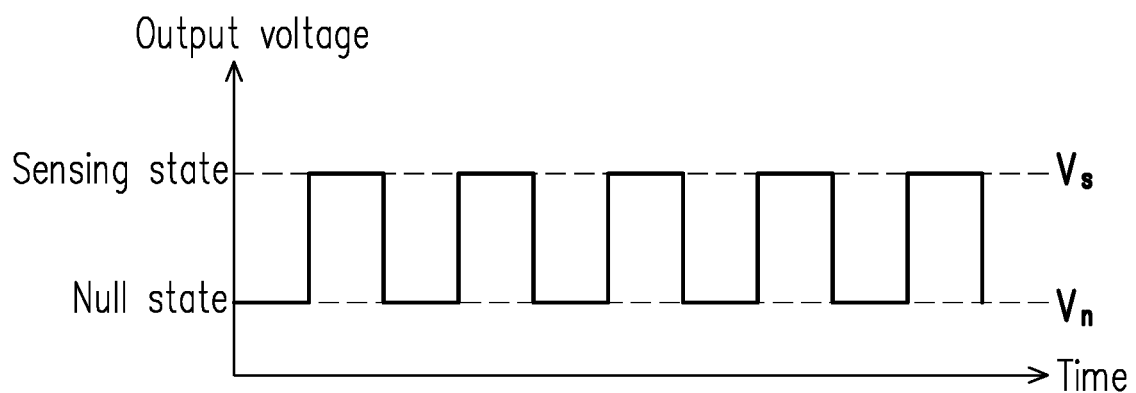
FIG. 9 is a schematic waveform graph of an output signal of the Wheatstone bridge of FIG. 8.

FIG. 9 is a schematic waveform graph of an output signal of the Wheatstone bridge of FIG. 8. With reference to FIG. 8 and FIG. 9, when the Wheatstone bridge is alternately switched between a sensing state (i.e., the magnetization setting element 110 is not applied the electric current to) and a null state (i.e., the magnetization setting element 110 is applied the electric current I to), a voltage signal outputted by the Wheatstone bridge in the sensing state is $V_s$, and a voltage signal outputted by the Wheatstone bridge in the null state is $V_n$. The operator calculates $V_s-V_n$ to obtain and output the net output signal.

Figure 10:
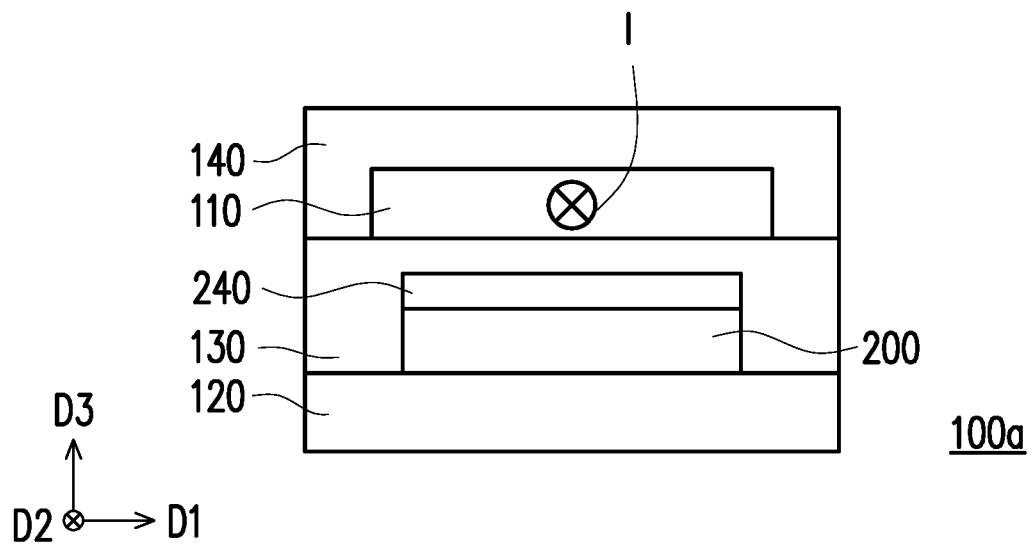
FIG. 10 is a schematic cross-sectional view of a magnetic field sensing device according to another embodiment of the disclosure.

FIG. 10 is a schematic cross-sectional view of a magnetic field sensing device according to another embodiment of the disclosure. With reference to FIG. 10, a magnetic field sensing device 100a of this embodiment is similar to the magnetic field sensing device 100 of FIG. 1, and a difference therebetween is described as follows. In the magnetic field sensing device 100a of this embodiment, the vortex magnetoresistor 200 is disposed on the substrate 120, and the first insulation layer 130 covers the vortex magnetoresistor 200. In addition, the magnetization setting element 110 is disposed on the first insulation layer 130, and the second insulation layer 140 covers the magnetization setting element 110. In this way, when being applied the electric current I to, the magnetization setting element 110 may still be capable of generating a strong magnetic field at the vortex magnetoresistor 200.

Figure 11:
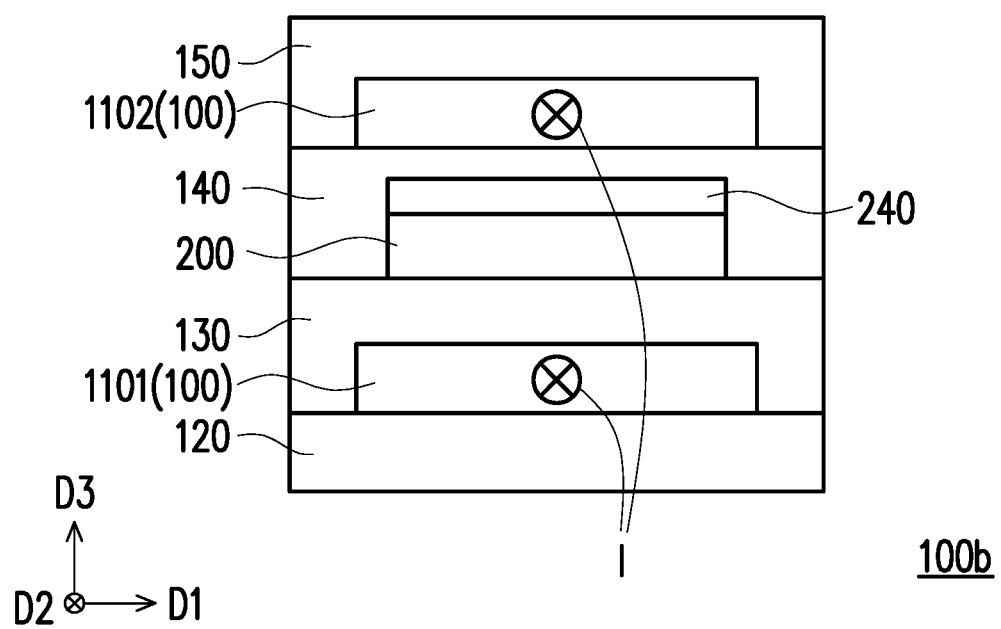
FIG. 11 is a schematic cross-sectional view of a magnetic field sensing device according to still another embodiment of the disclosure.

FIG. 11 is a schematic cross-sectional view of a magnetic field sensing device according to still another embodiment of the disclosure. With reference to FIG. 11, a magnetic field sensing device 100b of this embodiment is similar to the magnetic field sensing device 100 of FIG. 1, and a difference therebetween is described as follows. The at least one magnetization setting element 110 of the magnetic field sensing device 100b of this embodiment includes a first magnetization setting element 1101 and a second magnetization setting element 1102, and the magnetic field sensing device 100b further includes a third insulation layer 150. Further, the first magnetization setting element 1101 is disposed on the substrate 120, the first insulation layer 130 covers the first magnetization setting element 1101, the vortex magnetoresistor 200 is disposed on the first insulation layer 130, and the second insulation layer 140 covers the vortex magnetoresistor 200. In addition, the second magnetization setting element 1102 is disposed on the second insulation layer 140, and the third insulation layer 150 covers the second magnetization setting element 1102. In this way, when being applied the electric current I to, the first magnetization setting element 1101 and the second magnetization setting element 1102 may still be capable of generating strong magnetic fields at the vortex magnetoresistor 200.

In view of the foregoing, in the magnetic field sensing device provided by the embodiments of the disclosure, since the round free layer having the magnetization direction distribution with the vortex shape is adopted, the direction of the external magnetic field sensed by the vortex magnetoresistor is less limited. In addition, in the magnetic field sensing device provided by the embodiments of the disclosure, since the magnetization setting element capable of destroying the magnetization direction distribution with the vortex shape of the round free layer is adopted to measure the flicker noise of the magnetic field sensing device itself, the magnetic field sensing device provided by the embodiments of the disclosure may effectively overcome the interference generated by the flicker noise.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A magnetic field sensing device, comprising:
   at least one vortex magnetoresistor, comprising:
      a pinning layer;
      a pinned layer, disposed on the pinning layer;
      a spacer layer, disposed on the pinned layer; and
      a round free layer, disposed on the spacer layer, having a magnetization direction distribution with a vortex shape; and
   at least one magnetization setting element, disposed at one side of the at least one vortex magnetoresistor, wherein the at least one magnetization setting element is alternately applied and not applied an electric current to, the magnetization direction distribution with the vortex shape of the round free layer is varied with an external magnetic field to sense the external magnetic field when the at least one magnetization setting element is not applied the electric current to, a magnetic field generated by the at least one magnetization setting element varies the magnetization direction distribution of the round free layer and makes the round free layer achieve magnetic saturation when the at least one magnetization setting element is applied the electric current to.

2. The magnetic field sensing device as claimed in claim 1, further comprising:
   a substrate, wherein the at least one magnetization setting element is disposed on the substrate;
   a first insulation layer, covering the at least one magnetization setting element, wherein the at least one vortex magnetoresistor is disposed on the first insulation layer; and
   a second insulation layer, covering the at least one vortex magnetoresistor.

3. The magnetic field sensing device as claimed in claim 1, further comprising:
   a substrate, wherein the at least one vortex magnetoresistor is disposed on the substrate;
   a first insulation layer, covering the at least one vortex magnetoresistor, wherein the at least one magnetization setting element is disposed on the first insulation layer; and
   a second insulation layer, covering the at least one magnetization setting element.

4. The magnetic field sensing device as claimed in claim 1, wherein the at least one magnetization setting element comprises a first magnetization setting element and a second magnetization setting element, and the magnetic field sensing device further comprises:
   a substrate, wherein the first magnetization setting element is disposed on the substrate;
   a first insulation layer, covering the first magnetization setting element, wherein the at least one vortex magnetoresistor is disposed on the first insulation layer;
   a second insulation layer, covering the at least one vortex magnetoresistor, wherein the second magnetization setting element is disposed on the second insulation layer; and
   a third insulation layer, covering the second magnetization setting element.

5. The magnetic field sensing device as claimed in claim 1, wherein the at least one vortex magnetoresistor is a plurality of vortex magnetoresistors which are electrically connected to form a Wheatstone bridge, and the Wheatstone bridge outputs a differential signal corresponding to the external magnetic field when the vortex magnetoresistors are in a state of sensing the external magnetic field.

6. The magnetic field sensing device as claimed in claim 5, wherein the Wheatstone bridge is electrically connected to an operator, the Wheatstone bridge outputs a null signal when the round free layers of the vortex magnetoresistors are in a magnetic saturation state, and the operator is configured to subtract the null signal from the differential signal corresponding to the external magnetic field to obtain a net output signal.

7. The magnetic field sensing device as claimed in claim 5, wherein the vortex magnetoresistors comprise a first vortex magnetoresistor, a second vortex magnetoresistor, a third vortex magnetoresistor, and a fourth vortex magnetoresistor, the first vortex magnetoresistor is electrically connected to the third vortex magnetoresistor and the fourth vortex magnetoresistor, the second vortex magnetoresistor is electrically connected to the third vortex magnetoresistor and the fourth vortex magnetoresistor, a pinning direction of the first vortex magnetoresistor is identical to a pinning direction of the second vortex magnetoresistor, a pinning direction of the third vortex magnetoresistor is identical to a pinning direction of the fourth vortex magnetoresistor, and the pinning direction of the first vortex magnetoresistor is opposite to the pinning direction of the third vortex magnetoresistor.

8. The magnetic field sensing device as claimed in claim 7, wherein directions of magnetic fields generated at the first to the fourth vortex magnetoresistors are perpendicular to the pinning directions of the first to the fourth vortex magnetoresistors when the at least one magnetization setting element is applied the electric current to.

9. The magnetic field sensing device as claimed in claim 1, wherein the spacer layer is a non-magnetic metal layer, and the at least one vortex magnetoresistor is a giant magnetoresistor.

10. The magnetic field sensing device as claimed in claim 1, wherein the spacer layer is an insulation layer, and the at least one vortex magnetoresistor is a tunneling magnetoresistor.

11. The magnetic field sensing device as claimed in claim 1, wherein the at least one magnetization setting element is a conductive sheet, a conductive coil, a conductive wire, or a conductor.

* * * * *